United States Patent
Rosenberger

(10) Patent No.: US 8,508,949 B2
(45) Date of Patent: Aug. 13, 2013

(54) MULTIPLE MICRO HF-CONTACT ARRANGEMENT

(75) Inventor: Bernd Rosenberger, Tittmoning (DE)

(73) Assignee: Rosenberger Hochfrequenztechnik GmbH & Co. KG, Fridolfing (DE)

( * ) Notice: Subject to any disclaimer, the term of this patent is extended or adjusted under 35 U.S.C. 154(b) by 349 days.

(21) Appl. No.: 12/677,564

(22) PCT Filed: Aug. 11, 2008

(86) PCT No.: PCT/EP2008/006606
§ 371 (c)(1),
(2), (4) Date: Jun. 21, 2010

(87) PCT Pub. No.: WO2009/033538
PCT Pub. Date: Mar. 19, 2009

(65) Prior Publication Data
US 2010/0302751 A1  Dec. 2, 2010

(30) Foreign Application Priority Data

Sep. 11, 2007  (DE) ............... 20 2007 012 719 U

(51) Int. Cl.
*H05K 7/00* (2006.01)
(52) U.S. Cl.
USPC ........... 361/760; 361/776; 361/777; 333/246; 333/260; 439/626; 439/629; 439/630; 439/631; 439/632; 439/636
(58) Field of Classification Search
USPC ............... 333/246, 260; 439/629, 626, 630, 439/631, 632, 636; 361/776, 777, 760
See application file for complete search history.

(56) References Cited

U.S. PATENT DOCUMENTS

| 4,030,792 A | * | 6/1977 | Fuerst | 439/65 |
| 4,140,361 A | * | 2/1979 | Sochor | 439/682 |
| 4,603,926 A | * | 8/1986 | Nesbit et al. | 439/63 |
| 4,684,203 A | * | 8/1987 | Bihler | 439/751 |
| 4,806,892 A | * | 2/1989 | Thorpe et al. | 333/246 |
| 4,907,990 A | * | 3/1990 | Bertho et al. | 439/851 |
| 5,342,211 A | * | 8/1994 | Broeksteeg | 439/108 |
| 5,980,337 A | * | 11/1999 | Little | 439/857 |
| 6,280,248 B1 | * | 8/2001 | Mitra | 439/571 |
| 6,322,403 B1 | * | 11/2001 | Lok et al. | 439/856 |
| 6,843,686 B2 | * | 1/2005 | Ohnishi et al. | 439/607.12 |
| 8,167,630 B2 | * | 5/2012 | Lemke et al. | 439/83 |
| 2004/0080386 A1 | * | 4/2004 | Kitamura et al. | 333/246 |
| 2004/0224559 A1 | * | 11/2004 | Nelson et al. | 439/608 |

(Continued)

FOREIGN PATENT DOCUMENTS

| DE | 27 05 621 A1 | 5/1978 |
| DE | 195 44 536 C1 | 2/1997 |
| EP | 0 905 812 A | 3/1999 |
| JP | 2001 015880 A | 1/2001 |
| WO | WO 98/09354 A | 3/1998 |

*Primary Examiner* — Hung S Bui
*Assistant Examiner* — James Wu
(74) *Attorney, Agent, or Firm* — DeLio & Peterson, LLC; Robert Curcio

(57) ABSTRACT

The invention relates to a multiple micro HF-contact arrangement with HF-connections for passing through or contacting in a housing opening or in a duct, in particular at the transition from coaxial line or microstrip line to a coplanar line. The HF-connection thus comprises at least two circuit boards arranged in a plane which may be connected to each other by means of a planar contact pin on one circuit board and at least one planar socket on the other circuit board.

9 Claims, 2 Drawing Sheets

(56) References Cited

U.S. PATENT DOCUMENTS

| | | | |
|---|---|---|---|
| 2005/0020134 A1* | 1/2005 | Winings et al. | 439/608 |
| 2006/0214744 A1* | 9/2006 | Margomenos | 333/33 |
| 2007/0207674 A1* | 9/2007 | Minich | 439/608 |
| 2008/0211604 A1* | 9/2008 | Katayama et al. | 333/21 R |

\* cited by examiner

MULTIPLE MICRO HF-CONTACT ARRANGEMENT

CROSS REFERENCE TO RELATED APPLICATION

This application is a National Phase filing under 35 U.S.C. §371 of PCT/EP/2008/006606 which was filed Aug. 11, 2008, and claims priority to German Application No. DE 20 2007 012 719.7 filed Sep. 11, 2007.

BACKGROUND OF THE INVENTION

1. Field of the Invention

The invention relates to a multiple RF micro-contact arrangement as defined in the preamble to claim 1.

2. Description of Related Art

In known contact arrangements of the generic kind, a requirement which often exists is for RF connections to be made in a passage, or in an aperture in a housing, of very restricted cross-sectional dimensions. An added factor which often makes things more difficult in this case is that what may be involved is a transition from a coaxial line or microstrip line to a coplanar line.

SUMMARY OF THE INVENTION

Bearing in mind the problems and deficiencies of the prior art, it is therefore an object of the present invention to provide a multiple RF micro-contact arrangement by means of which it is possible for a large number of radio-frequency connections to be made, or to be made possible, in an extremely confined space, for example, in a passage or in an aperture in a housing.

This object is achieved by the invention by virtue of the features of claim 1. Advantageous embodiments of the invention are described in the other claims.

Still other objects and advantages of the invention will in part be obvious and will in part be apparent from the specification.

The above and other objects, which will be apparent to those skilled in the art, are achieved in the present invention which is directed to an RF micro-contact including an RF connection which is to be run through, or make contact in, a housing aperture or in a passage, at the transition from a coaxial line or microstrip line to a coplanar line, wherein the RF connection comprises at least two printed circuit boards arranged approximately in a plane, connected together by at least one planar contact pin belonging to one of the at least two printed circuit boards and at least one planar socket belonging to the other of the at least two printed circuit boards. The RF micro-contact may include a plurality of pairs of printed circuit boards arranged in the housing aperture. Each of the plurality of pairs of printed circuit boards may comprise a contact pin and a corresponding socket. At least one planar contact pin may comprise an extended contacting lug, which compensates for tolerances. Additionally, each of the at least one planar socket may be comprised of a U-shaped component having two resilient contacting arms for receiving a corresponding contact pin. The contacting arms of the planar socket may project inwardly at or close to their open end, allowing for stronger contact to be made with the corresponding contact pin.

The at least one planar contact pin and the at least one planar socket may each be fastened to an associated printed circuit board by respective bases. The respective base may be integral with the contact pin or the socket The base of each contact pin or each planar socket includes, at or close to the point at which it is fastened to the printed circuit board, an intended bend-point, which serves to compensate for tolerances. The bases of each contact pin or each planar socket may also comprise a weakened cross-section of the base.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiment of the present invention, reference will be made herein to FIGS. 1-5 of the drawings in which like numerals refer to like features of the invention.

The invention is based on implementing the multiple RF micro-contact arrangement for a housing aperture of the kind presently being considered by giving the RF connection at least two printed circuit boards, arranged in a plane, which can be connected together by means of at least one planar contact pin belonging to one printed circuit board and at least one planar socket belonging to the other printed circuit board.

Because of the very limited space which an arrangement of this kind of printed circuit boards which are provided in pairs take up, it is possible in accordance with the invention for several, or even indeed a large number of, pairs of printed circuit boards to be arranged in the housing aperture.

In accordance with the invention the number of RF connections to be provided can also be increased dramatically by giving each pair of printed circuit boards a plurality of contact pin and socket arrangements.

In an embodiment of the invention, provision is made for each planar contact pin belonging to the one printed circuit board to take the form of an extended contacting lug, particularly for the purpose of compensating for tolerances.

It is also within the scope of the invention in this case for each contact pin to have a planar contacting lug which has an elevation, in order in this way to facilitate the making of contact with the planar socket and to ensure that it always happens.

It is of advantage in accordance with the invention for each planar socket belonging to the other printed circuit board to take the form of a U-shaped component having two contacting arms for the resilient reception of a contact pin.

The contacting arms of the planar socket usefully have inwardly projecting projections at or close to their open end to allow stronger contact to be made with a contact pin.

Both the planar contact pin and also the planar socket are advantageously fastened to the associated printed circuit boards by respective, preferably integral, bases.

Particular advantages are obtained in this case if the base of each contact pin and/or of each planar socket has, at or close to the point at which it is fastened to the printed circuit board, an intended bend-point, in the form of a weakened cross-section of the base for example, which serves in particular to compensate for tolerances.

Figure 1:
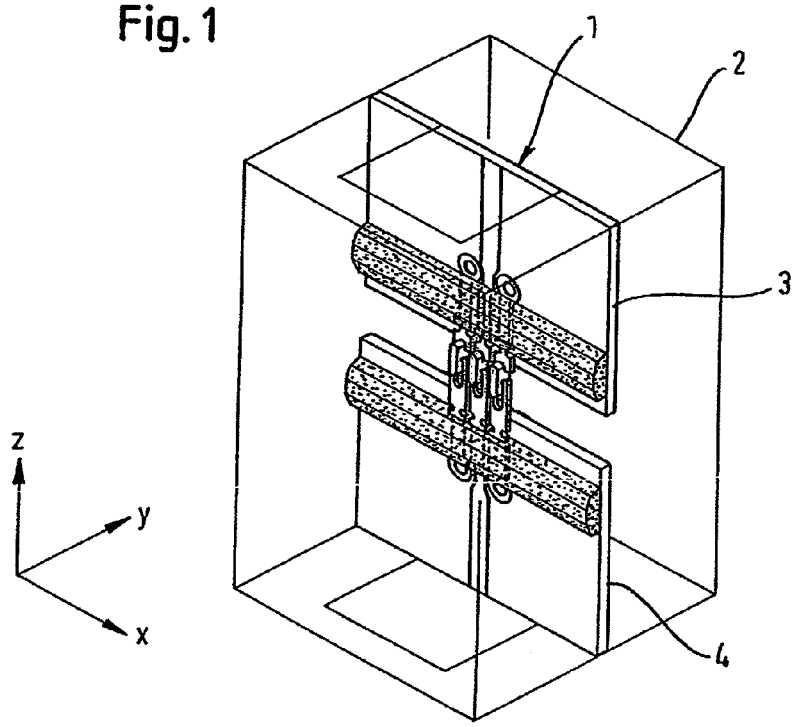
FIG. 1 is a schematic perspective view of a multiple RF micro-contact arrangement having a single pair of printed circuit boards arranged in an aperture in a housing.
Figure 4:
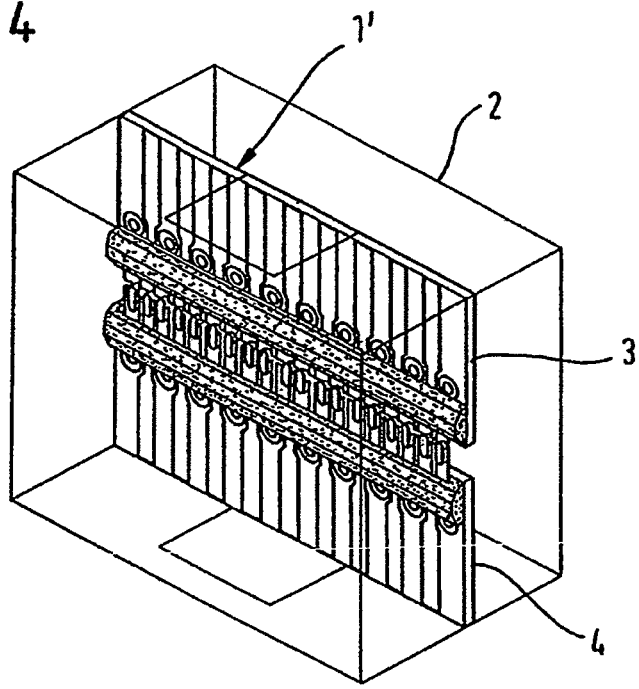
FIG. 4 is a schematic perspective view of a pair of printed circuit boards which are arranged in a housing aperture and which have a plurality of RF connections.
Figure 5:
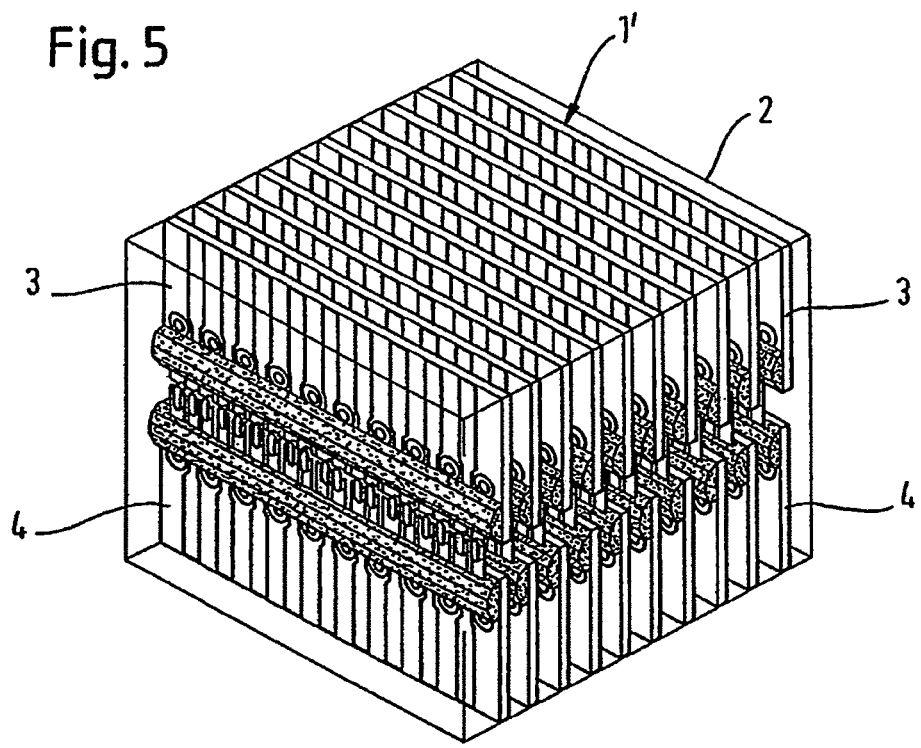
FIG. 5 is a perspective view of a plurality of pairs of printed circuit boards arranged in a housing aperture, each of which pairs has a plurality of RF connections.

As can be seen from the drawings, and in particular from FIGS. 1, 4 and 5, the multiple RF micro-contact arrangement 1 which is shown is intended for installation or arrangement in a housing aperture 2 of typically very restricted cross-sectional dimensions.

The contact arrangement which is shown is the transition from a coaxial line or microstrip line to a coplanar line.

Figure 2:
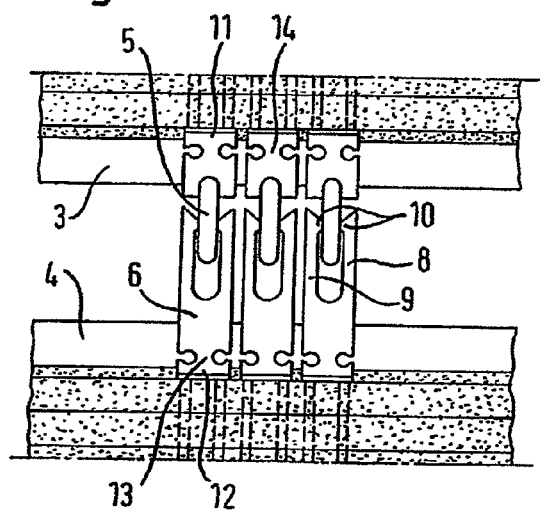
FIG. 2 is a plan view of the RF connection between two printed circuit boards.
Figure 3:
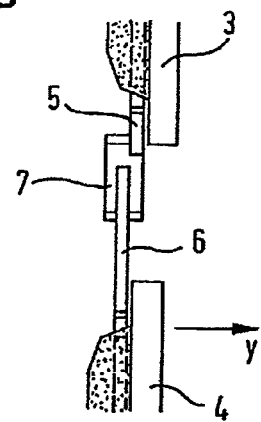
FIG. 3 is a view from the side of the RF connection between two printed circuit boards.

As can clearly be seen from FIGS. 1 to 3, the contact arrangement 1 which is shown has at least two printed circuit boards 3, 4 which are arranged in a parallel plane, which in this case is the z plane shown in FIG. 1, which two printed circuit boards 3, 4 can be connected together by means of at least one planar contact pin 5 belonging to one printed circuit board 3 and by means of at least one planar socket 6 belonging to the other printed circuit board 4.

Because of this design, it is possible for each pair of printed circuit boards 3, 4 to have a plurality of contact pin and socket arrangements 5, 6, as can clearly be seen from FIGS. 2, 4 and 5.

To enable a secure RF connection to be made, each planar contact pin 5 belonging to the one printed circuit board 3 takes the form of an extended contacting lug. This serves to make the desired compensation for tolerances in the z direction of the contact arrangement.

In addition to this, the planar contacting lug of each contact pin 5 is provided with an elevation 7 in order in this way to facilitate and ensure the making of contact by the contact pin 5 with the planar socket 6 or in other words the insertion thereof in the planar socket 6.

The design provided for each planar socket 6 belonging to the other printed circuit board 4 is such that it takes the form of a U-shaped component having two contacting arms 8, 9 which serve for the resilient reception of an associated contact pin 5.

As can clearly be seen from FIG. 2 in this case, the contacting arms 8, 9 of the planar socket 6 have, at their open end, inwardly projecting projections 10 which serve to strengthen the contact made with a contact pin 5, and also to make it resilient.

As can also be seen from FIG. 2, it is of particular importance for both each planar contact pin 5 and also each planar socket 5 to have integral bases 11 and 12 respectively by means of which they are fastened in the manner shown to the associated printed circuit boards 3 and 4 respectively.

The bases 11 and 12 respectively of each contact pin 5 and each planar socket 6 have, at the relevant points to which they are fastened, intended bend-points 14 and 13 respectively in the form of a weakened cross-section. This serves, as shown, to make an advantageous compensation for tolerances in the x direction (see FIG. 1).

In the modified embodiment which is shown in FIG. 4, the contact arrangement 1' which is shown comprises a pair of printed circuit boards 3, 4 which have a plurality of RF connections 5, 6 of the kind described.

Finally, in the more extensively modified embodiment which is shown in FIG. 5, there are provided in a similar way in the housing aperture 2 a plurality of pairs of printed circuit boards 3, 4 which are connected by means of the contact pin and socket arrangement 5, 6 which has been described.

For any features of the invention which are not explained in detail above, the reader is explicitly referred to the drawings and the claims.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. An (radio frequency) RF micro-contact including an RF connection wherein said RF connection is to be run through, or make contact in, a housing aperture or in a passage, at a transition from a first type of transmission line electrical connector configuration on a first printed circuit board to a second type of transmission line electrical connector configuration on a second printed circuit board, wherein said RF connection comprises at least said two printed circuit boards arranged approximately in a plane, connected together by at least one planar contact pin belonging to one of said at least two printed circuit boards and at least one planar socket belonging to the other of said at least two printed circuit boards, wherein
    said contact pin and said socket are fastened to each associated printed circuit board by respective bases;
    the socket comprises a U-shaped component having two resilient contacting arms for receiving a corresponding contact pin, whereas the two resilient arms define a plane which is parallel to the plane said two printed circuit boards are arranged in, which serves to compensate for tolerances in a first direction being perpendicular to the plane said printed circuit boards are arranged in; and
    the base of each contact pin or each planar socket includes, at or close to a point where fastened to the printed circuit board, an intended bend-point, which serves to compensate for tolerances in a second direction being parallel to the plane the printed circuit boards are arranged in, wherein the bend-point is formed by a weakened cross-section of said base.

2. The RF micro-contact of claim 1, including a plurality of pairs of printed circuit boards arranged in the housing aperture.

3. The RF micro-contact of claim 2, including having each of said plurality of pairs of printed circuit boards comprise a contact pin and a corresponding socket.

4. The RF micro-contact of claim 1 including having said at least one planar contact pin comprise an extended contacting lug, which compensates for tolerances in a third direction being perpendicular to the first and second direction.

5. The RF micro-contact of claim 1 including having each of said at least one planar contact pin comprise a planar contacting lug having an elevation.

6. The RF micro-contact of claim 1 including the contacting arms of the planar socket comprising inwardly projecting projections at or close to their open end, allowing for stronger contact to be made with said corresponding contact pin.

7. The RF micro-contact of claim 2 including having each of said at least one planar contact pin comprise an extended contacting lug which compensates for tolerances.

8. The RF micro-contact of claim 4 including having each of said at least one planar contact pin comprise a planar contacting lug having an elevation.

9. The RF micro-contact of claim 1 including having said respective base integral with said contact pin or said socket.

* * * * *